United States Patent [19]

Tokumo et al.

[11] Patent Number: 4,968,948
[45] Date of Patent: Nov. 6, 1990

[54] PULSE WIDTH MODULATION AMPLIFIER CIRCUIT

[75] Inventors: Akio Tokumo; Masayuki Kato; Takeshi Sato; Tatsuzo Hasegawa, all of Saitama, Japan

[73] Assignee: Pioneer Electronic Corporation, Tokyo, Japan

[21] Appl. No.: 379,768

[22] Filed: Jul. 14, 1989

[30] Foreign Application Priority Data

Dec. 28, 1988 [JP] Japan .................. 63-328808

[51] Int. Cl.⁵ .............................................. H03F 3/38
[52] U.S. Cl. .................................................... 330/10
[58] Field of Search ................... 330/10, 207 A, 251; 363/41

[56] References Cited

FOREIGN PATENT DOCUMENTS 157066 12/1979 Japan ................................. 330/10

Primary Examiner—James B. Mullins
Attorney, Agent, or Firm—Sughrue, Mion, Zinn, Macpeak & Seas

[57] ABSTRACT

A balanced transformer-less pulse width modulation amplifier circuit has two filter coils wound on the same core with the same polarity relative to the output. The arrangement reduces the possibility of magnetic saturation of the core and permits the cutoff frequency to be within the audio range.

3 Claims, 2 Drawing Sheets

FIG. 1
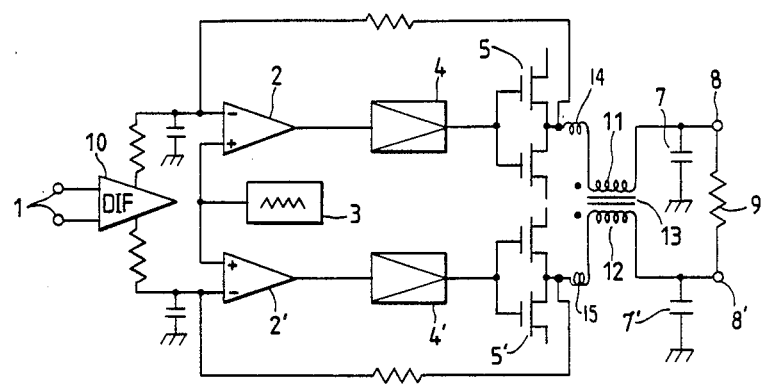
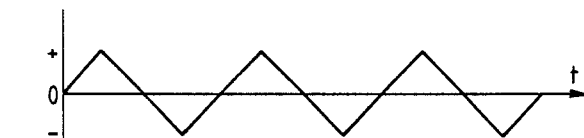
FIG. 2A
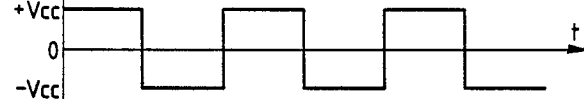
FIG. 2B
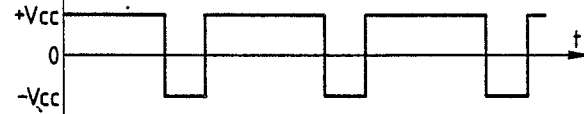
FIG. 2C
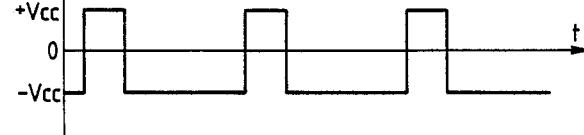
FIG. 2D

PULSE WIDTH MODULATION AMPLIFIER CIRCUIT

BACKGROUND OF THE INVENTION

The present invention relates to a pulse width modulation amplifier circuit having a balanced transformerless (BTL) output connection and particularly to a filter circuit for eliminating a carrier signal.

Pulse width modulation amplifiers (referred to as PWM amplifiers) are known for modulating a high frequency triangular-wave carrier signal with an analog signal such as an audio signal into a pulse width modulation, signal Such amplifiers power-amplify the pulse width signal and eliminate the carrier signal by means of a demodulation filter. Those amplifiers are very efficient for power amplification and thus they have recently been used in audio devices intended for automobiles.

In FIG. 3, an example of PWM amplifiers is shown. An analog signal at an input terminal 1 is applied to the inverted input terminal of a comparator 2, while its non-inverted input terminal has applied thereto an output signal from a high frequency (e.g., about 200 KHz) triangular-Wave generator 3. This causes the carrier signal to be modulated into a pulse width signal. After being amplified by a driving amplifier 4, the pulse width modulation signal from the comparator 2 is amplified by a pulse amplifier (power amplifier) 5 consisting of power FET's of the N-channel MOS type. The carrier signal is eliminated by a filter circuit consisting of a choke coil 6 and a condenser 7, and the remaining signal drives a load, for example a speaker 9, connected with the output terminals 8.

FIG. 4 shows a conventional BTL circuit where two such PWM amplifiers as described above are used.

In the BTL circuit, the analog signal applied to the input terminal 1 is converted into first and second analog signals which differ in phase from each other by 180 degrees by means of a differential circuit 10 or the like. The first analog signal is converted into a pulse width modulation signal by the first comparator 2, is amplified by a driving amplifier 4 and a pulse width amplifier 5 has its carrier eliminated by a choke coil 6 and a condenser 7, and is led to an output terminal 8. In the same manner the second analog signal is converted into a pulse width modulation signal by a second comparator 2', is amplified by a driving amplifier 4' and a pulse width amplifier 5', has its carrier eliminated by a choke coil 6' and a condenser 7', and is led to an output terminal 8'.

Both ends of a load, e.g., a speaker or the like, are connected between the above output terminals 8 and 8', therefore the load 9 is supplied with demodulated analog outputs of opposite phase by a pair of PWM amplifiers. Since the voltage between the terminals of the load becomes twice the output voltage that can be gained from a single PWM amplifier, it is logically possible to have the output apply to the load 9 four times the electric power that can be obtained with a single PWM amplifier.

In the BTL-PWM amplifier mentioned above the first and second PWM amplifiers need to be provided with carrier eliminating filters each consisting of a choke coil and a condenser. Since the choke coils are supplied with pulse signals such as those of about 200 KHz, toroidal chock coils are usually used in order to prevent the occurrence of radiating noise.

Large currents occur in each of the above-mentioned chock coils as a result of being driven by audio outputs, and this causes the choke coils to be saturated by DC magnetization, which untowardly lowers the function of the filter. To prevent this problem, the size of the core of each filter may be made large.

Furthermore, it is difficult to determine the cutoff frequency of the filter circuit consisting of a choke coil and a condenser because of two conflicting requirements. First the cutoff frequency should be set considerably high in order not to affect the output in the audio signal band, and second, the cutoff frequency should be set considerably low in order to attain sufficient attenuation of the carrier.

SUMMARY OF THE INVENTION

The present invention is based on consideration of the above-mentioned problems of PWM amplifiers. Therefore, it is an object to provide a PWM amplifier having small chock coils which smooth pulse outputs and at the same time sufficiently attenuates the carrier without affecting the audio output.

To accomplish the above object, the present invention is characterized in that in a pulse width modulation amplifier circuit with a balanced transformer-less (BTL) output has first and second filter coils wound partly or wholly onto a single core. One BTL output is connected with one end of a load and the other BTL output is connected with the other end of the load. The two coils have the same winding polarity with respect to the BTL outputs.

BRIEF DESCRIPTION OF THE DRAWINGS

FIG. 1 is a block diagram of an embodiment of the present invention;

FIG. 2 is a waveform chart illustrating the operation of pulse width modulation;

DESCRIPTION OF THE PREFERRED EMBODIMENTS

Referring to FIG. 1, an embodiment of pulse width modulation amplifier circuits according to the present invention will be described below.

Figure 3:
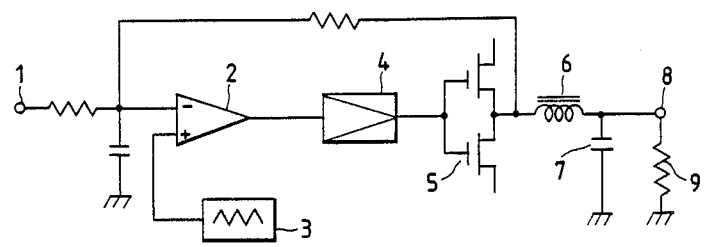
FIG. 3 is a block diagram showing the basic structure of a conventional pulse width modulation amplifier.
Figure 4:
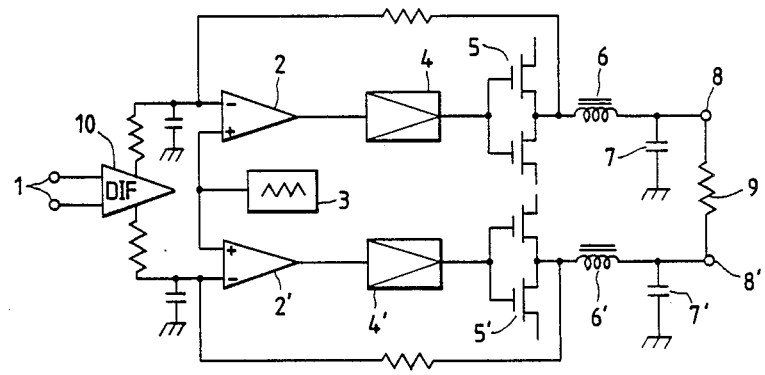
FIG. 4 is a block diagram showing a conventional pulse width modulation amplifier circuit having a BTL structure.

In FIG. 1 parts which correspond to those denoted by the numerals 1 to 5, 7 to 10, 2' to 5', and 7' in FIG. 4 are represented by like numerals, and their explanations are omitted.

A first coil 11 connects the output terminal of the first pulse width amplifier 5 with the output terminal 8 of load 9, while a second coil 12 connects the output terminal of the second pulse width amplifier 5' with the output terminal 8' of load 9. The foregoing first and second coil 11, 12 are wound onto the same core 13. The coils 11 and 12 are connected so as to be in common polarity (in common mode) from the view points of the output terminals of the first and second pulse width amplifiers 5, 5'.

In the above-mentioned structure, assuming that a triangular-wave carrier generated by the oscillator 3 is in the form shown in FIG. 2(A), when an analog input signal applied to the input terminal 1 is zero the pulse width amplifiers 5 and 5' will produce square wave pulses as shown in FIG. 2(B).

However, when the analog input signal applied to the input terminal 1 is at a high level the pulse outputs generated from the pulse width amplifiers 5 and 5' will become as shown in FIG. 2(C) and (D) because the analog signals applied to inverted-input terminals of the first and second comparators 2, 2' are at a same level but opposite in phase.

The pulse output waveforms of FIGS. 2(C) and (D) are applied after amplification to the first and second choke coils 11, 12, respectively. At this time, since both coils 11 and 12 are wound onto the same core 13 and are so connected as to be in common mode, the analog signals act on the core 13 in opposite phase relationships, thereby cancelling each other. As a result, coil 13 will not easily become magnetically saturated. Also since the coils 11 and 12 do not act on the analog signal as a coil, that is, they have no effect as an inductance component on the analog signal, it becomes possible to set the cutoff frequency with respect to the carrier signal for an arbitrary frequency including the audio frequency band.

As for carrier signals, since the above-mentioned coils 11, 12 are in a same phase relation, mutual inductance by the coils 11 12 wound onto the same core 13 causes an inductance component to double. Therefore the core 13 can be made even smaller in addition to the effect of miniaturization of the core 13 caused by little possibility of magnetic saturation.

When the analog input level becomes high the phases of the pulse signals produced by pulse width amplifiers 5, 5' may not be in a same phase relation at every point of time. If this is the case, there is a probability that it may be hard to completely eliminate the carrier signal by means of the common mode choke coils alone as mentioned above.

As a countermeasure to this, additional choke coils 14, 15 of comparatively small inductance may be provided separately in series to the above-mentioned first and second coils 11, 12 as illustrated in FIG. 1. This makes it possible to eliminate the carrier signal completely.

As choke coils added in series, very small ones can be made to serve the purpose. Therefore, even in the latter case it is possible to make a much smaller filter as compared with that of conventional ones.

As is clear from the above description, since in the present invention, common mode choke coils are used for a filter of BTL-PWM amplifiers the choke coils suppress each other for analog signals and will not easily become saturated magnetically, which serves to miniaturize the core size. Also, since the two coils do not act as inductance on analog signals, the cutoff frequency of the filter can be lowered to the audio frequency band, so that sufficient filter effect can be brought to the carrier signals.

Moreover, since mutual inductance increases the inductance component with respect to the carrier signals it is possible to lessen the winding turns of the coil, making it possible to largely reduce the volume of filters as compared with conventional ones in which two discrete choke coils are used.

What is claimed is:

1. In a balanced transformer-less pulse width modulation amplifier circuit of the type having a first and second filter where outputs are connected respectively across a common load, said first filter including a first filter coil and said second filter including a second filter coil, the improvement comprising:
    said first and second filter coils being wound at least partially on the same core and each having the same winding polarity with respect to the circuit outputs; and
    first and second choke coils separately connected in series with said first and second filter coils, respectively, said first and second choke coils being small in inductance in comparison to said first and second filter coils.

2. A circuit as claimed in claim 1, wherein the cutoff frequencies of each said filter coil is within the audio range.

3. A circuit as claimed in claim 1, wherein said first and second filter coils are wholly wound on the same core.

* * * * *